US010432213B1

(12) United States Patent
Aboudina et al.

(10) Patent No.: US 10,432,213 B1
(45) Date of Patent: Oct. 1, 2019

(54) SUCCESSIVE APPROXIMATION REGISTER (SAR) ANALOG TO DIGITAL CONVERTER (ADC) WITH OVERLAPPING REFERENCE VOLTAGE RANGES

(71) Applicant: GOODIX TECHNOLOGY INC., San Diego, CA (US)

(72) Inventors: Mohamed Aboudina, San Diego, CA (US); Ali Farid, San Diego, CA (US); Ahmed Emira, San Diego, CA (US); Hassan Elwan, San Diego, CA (US)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 16/029,644

(22) Filed: Jul. 8, 2018

(51) Int. Cl.
*H03M 1/46* (2006.01)

(52) U.S. Cl.
CPC ........... *H03M 1/468* (2013.01); *H03M 1/462* (2013.01); *H03M 1/466* (2013.01)

(58) Field of Classification Search
None
See application file for complete search history.

(56) References Cited

U.S. PATENT DOCUMENTS

| | | | | |
|---|---|---|---|---|
| 4,385,286 A * | 5/1983 | Haque | ................. | H04B 14/048 341/108 |
| 8,581,761 B1 | 11/2013 | Bahukhandi et al. | | |
| 8,766,833 B1 * | 7/2014 | Bogner | ............... | H03M 1/1014 341/120 |
| 8,860,600 B1 * | 10/2014 | Yang | ..................... | H03M 1/466 341/150 |
| 2012/0326900 A1 * | 12/2012 | Wu | ..................... | H03M 1/0673 341/110 |
| 2014/0008515 A1 | 1/2014 | Wang et al. | | |
| 2015/0263756 A1 * | 9/2015 | Chiu | ..................... | H03M 1/468 341/118 |
| 2018/0115317 A1 * | 4/2018 | Fan | ....................... | H03M 1/002 |

OTHER PUBLICATIONS

European Search Report dated Jul. 25, 2019 in the corresponding EP application (application No. 13847231.0).
McCreary J L et al: 11 Al I-MOS Charge Redistribution Analog-To-Digital Conversion Techniques-Part I 11, IEEE Journal of Solid-State Circuits, IEEE Service Center, Piscataway, NJ, USA, vol. SC-10, No. 6, Dec. 1, 1975 (Dec. 1, 1975), pp. 371-379, XP000916718.

* cited by examiner

*Primary Examiner* — Howard Williams
(74) *Attorney, Agent, or Firm* — Kilpatrick Townsend & Stockton LLP

(57) ABSTRACT

An analog to digital converter (ADC) is disclosed. The ADC includes a DAC which generates a first signal based on an analog input and a digital input word, and a comparator which generates a comparator output having a value corresponding with a sign of a difference between first and second signals. During a first time period, the second signal is equal to a reference signal, the first signal is equal to an analog input, and the comparator generates a first comparator output. During a second time period, the second signal is equal to the reference signal, the first signal is equal to a the analog input plus a predetermined signal, and the comparator generates a second comparator output. A SAR logic circuit generates the digital input word for the DAC based on the first and second comparator outputs.

20 Claims, 6 Drawing Sheets

SUCCESSIVE APPROXIMATION REGISTER (SAR) ANALOG TO DIGITAL CONVERTER (ADC) WITH OVERLAPPING REFERENCE VOLTAGE RANGES

FIELD OF THE INVENTION

The present invention relates generally to a successive approximation register (SAR) analog to digital converter (ADC), and more particularly to a SAR ADC which has a margin for varying input voltage, and which has a reference voltage equal to about half the voltage of the difference between the maximum input voltage and the minimum input voltage.

BACKGROUND OF THE INVENTION

Conventional SAR ADC architectures use reference voltages which are equal to or are substantially equal to the maximum input voltage. Because the reference voltage is used in a capacitive digital to analog converter (CDAC), the power used by the CDAC is significantly affected by the value of the reference voltage. In addition, power and latency are affected by the number of clock cycles required by the SAR to complete the conversion.

BRIEF SUMMARY OF THE INVENTION

One inventive aspect is a successive approximation register (SAR) analog to digital converter (ADC). The SAR ADC includes a SAR logic circuit configured to generate a digital input word, a DAC, configured to receive the digital input word and an analog input, and to generate a first signal based on the analog input and the digital input word. The SAR ADC also includes a comparator, including a first input terminal configured to receive the first signal, and a second input terminal configured to receive a second signal, where the comparator is configured to generate a comparator output based on the first and second signals. The comparator output has a value corresponding with a sign of a difference between the first and second signals. During a first time period, the second signal is equal to a reference signal, the first signal is equal to a the analog input, and the comparator is configured to generate a first comparator output based on the first and second signals of the first time period. During a second time period, the second signal is equal to the reference signal, the first signal is equal to a the analog input plus a predetermined signal, and the comparator is configured to generate a second comparator output based on the first and second signals of the second time period. The SAR logic circuit is further configured to receive the first and second comparator outputs, and to generate the digital input word for the DAC based on the first and second comparator outputs.

In some embodiments, the SAR logic is configured to determine the MSB of the digital output word based on the first comparator output.

In some embodiments, the SAR logic is configured to generate a digital representation of the analog input based on the first and second comparator outputs.

In some embodiments, during a third time period, the second signal is equal to the reference signal, and the first signal is equal to a the analog input plus a predetermined signal plus a step, where the sign of the step is determined by the SAR logic based on the second comparator output, and where the comparator is configured to generate a third comparator output based on the first and second signals of the third time period.

In some embodiments, the SAR logic is configured to generate a digital representation of the analog input based on the first, second, and third comparator outputs.

In some embodiments, the DAC includes a plurality of capacitors and a plurality of switches, where each of the switches is connected to a particular one of the capacitors, is selectively connected to either of a ground voltage and a reference voltage, and is configured to selectively connect the particular capacitor to either of the ground voltage and the reference voltage.

In some embodiments, during the second period, the SAR logic is configured to cause the DAC to generate the first signal such that the first signal is equal to a voltage of the analog input plus a predetermined voltage, where, in response to the first comparator output indicating that the analog input is less than the reference signal, while the first signal is generated, one or more of the switches of the DAC are switched from being connected to the ground voltage to being connected to the reference voltage.

In some embodiments, the one or more switches correspond with the particular capacitors of the DAC which, in response to the one or more switches being switched, cause a voltage of the first signal to increase by the predetermined voltage.

In some embodiments, during the second period, the SAR logic is configured to cause the DAC to generate the first signal such that the first signal is equal to a voltage of the analog input minus a predetermined voltage, where, in response to the first comparator output indicating that the analog input is greater than the reference signal, while the first signal is generated, one or more of the switches of the DAC are switched from being connected to the reference voltage to being connected to the ground voltage.

In some embodiments, the one or more switches correspond with the particular capacitors of the DAC which, in response to the one or more switches being switched, cause a voltage of the first signal to decrease by the predetermined voltage.

Another inventive aspect is a method of determining a digital output word having a value corresponding with an analog input value with a successive approximation register (SAR) analog to digital converter (ADC). The method includes, with a SAR logic circuit of the SAR ADC, generating a digital input word. The method also includes, with a DAC of the SAR ADC receiving a digital input word and an analog input, and generating a first signal based on the analog input and the digital input word. The method also includes, with a comparator of the SAR ADC receiving the first signal at a first input terminal, receiving a second signal at a second input terminal, and generating a comparator output based on the first and second signals. The comparator output has a value corresponding with a sign of a difference between the first and second signals. During a first time period, the second signal is equal to a reference signal, the first signal is equal to a the analog input, and the comparator is configured to generate a first comparator output based on the first and second signals of the first time period. During a second time period, the second signal is equal to the reference signal, the first signal is equal to a the analog input plus a predetermined signal, and the comparator is configured to generate a second comparator output based on the first and second signals of the second time period. The method also includes, with an SAR logic circuit of the SAR ADC, receiving the first and second comparator outputs, and generating the digital input word for the DAC based on the first and second comparator outputs.

In some embodiments, the method also includes with the SAR logic, determining the MSB of the digital output word based on the first comparator output.

In some embodiments, the method also includes, with the SAR logic, generating a digital representation of the analog input based on the first and second comparator outputs.

In some embodiments, during a third time period, the second signal is equal to the reference signal, and the first signal is equal to a the analog input plus a predetermined signal plus a step, where the sign of the step is determined by the SAR logic based on the second comparator output, and where the method further includes, with the comparator, generating a third comparator output based on the first and second signals of the third time period.

In some embodiments, the method also includes with the SAR logic, generating a digital representation of the analog input based on the first, second, and third comparator outputs.

In some embodiments, the DAC includes a plurality of capacitors and a plurality of switches, where each of the switches is connected to a particular one of the capacitors, and is selectively connected to either of a ground voltage and a reference voltage, and the method includes, with the switches, connecting each particular capacitor to either of the ground voltage and the reference voltage.

In some embodiments, the method also includes, during the second period, with the SAR logic causing the DAC to generate the first signal such that the first signal is equal to a voltage of the analog input plus a predetermined voltage, and, in response to the first comparator output indicating that the analog input is less than the reference signal, while the first signal is generated, switching one or more of the switches of the DAC from being connected to the ground voltage to being connected to the reference voltage.

In some embodiments, the one or more switches correspond with the particular capacitors of the DAC which, in response to the one or more switches being switched, cause a voltage of the first signal to increase by the predetermined voltage.

In some embodiments, the method also includes, during the second period, with the SAR logic causing the DAC to generate the first signal such that the first signal is equal to a voltage of the analog input minus a predetermined voltage, and, in response to the first comparator output indicating that the analog input is greater than the reference signal, while the first signal is generated, switching one or more of the switches of the DAC from being connected to the reference voltage to being connected to the ground voltage.

In some embodiments, the one or more switches correspond with the particular capacitors of the DAC which, in response to the one or more switches being switched, cause a voltage of the first signal to decrease by the predetermined voltage.

DETAILED DESCRIPTION OF THE INVENTION

Particular embodiments of the invention are illustrated herein in conjunction with the drawings.

Various details are set forth herein as they relate to certain embodiments. However, the invention can also be implemented in ways which are different from those described herein. Modifications can be made to the discussed embodiments by those skilled in the art without departing from the invention. Therefore, the invention is not limited to particular embodiments disclosed herein.

The present invention is related to an SAR ADC. The SAR ADC determines a corresponding digital value for an analog input based on a successive approximation system. A particular embodiment of the SAR ADC is designed to generate digital values for analogue inputs ranging between a minimum input value and a maximum input value. As discussed in further detail below, the successive approximation system uses a reference voltage value to generate the digital values. In the embodiments discussed, the reference voltage is approximately or substantially equal to 1 half the difference between the maximum input value and the minimum input value.

Figure 1:
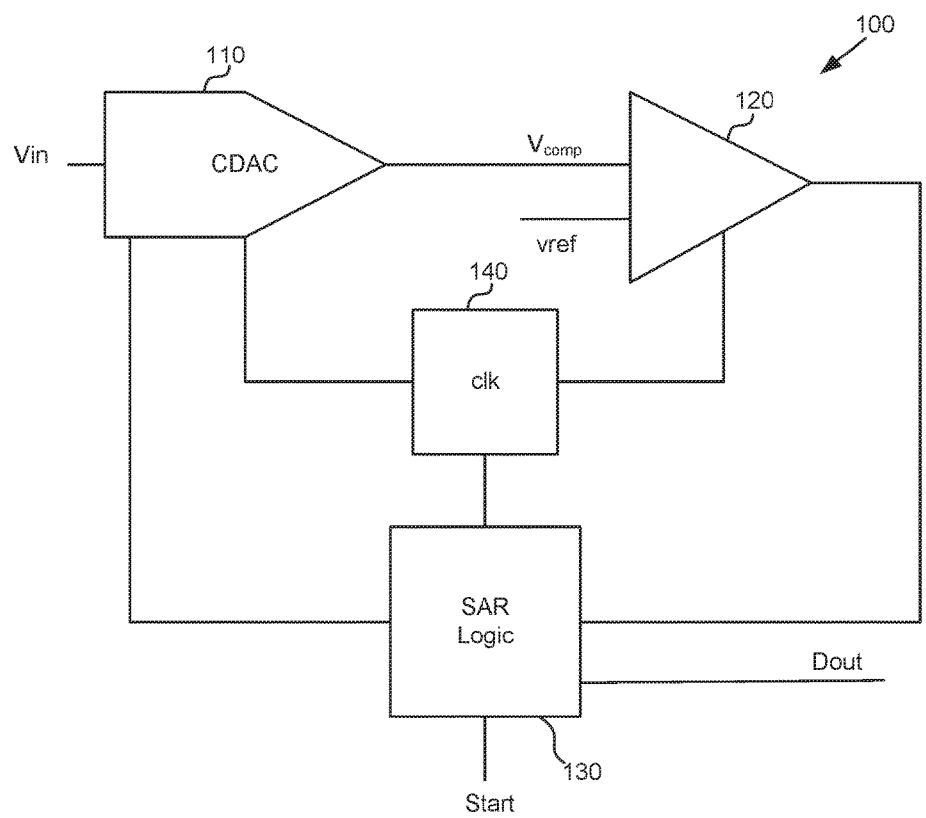
FIG. 1 is a schematic illustration of an SAR ADC according to one embodiment.

FIG. 1 is a schematic illustration of an SAR ADC 100 according to one embodiment. SAR ADC 100 includes CDAC 110, comparator 120, SAR logic 130 and clock generator 140.

SAR ADC 100 receives an analog input value at Vin. In response to a start signal, SAR ADC 100 calculates and generates a digital value corresponding with the analog input value Vin. Once calculated, SAR ADC 100 provides the digital value as output word Dout.

To determine the digital value, SAR ADC 100 determines a most significant bit (MSB), and subsequently determines each of the other bits of the digital output word. To determine the MSB, in response to one or more clock signals from clock generator 140, the analog input voltage Vin is provided to comparator 120 as voltage Vcomp, and comparator 120 compares voltage Vcomp with reference voltage Vref and generates an output voltage corresponding with the results of the comparison. In addition, in response to one or more clock signals from clock generator 140, SAR logic 130 receives the output from the comparator 120, and determines and stores an MSB based on the output from the comparator 120.

To determine each of the other bits of the digital output word, in response to each of one or more clock signals from clock generator 140, SAR logic 130 determines a next digital input word for CDAC 110, and CDAC 110 generates a next voltage Vcomp. In addition, in response to each of one or more clock signals from clock generator 140, comparator 120 compares the next voltage Vcomp with reference voltage Vref and generates an output voltage corresponding with the results of the comparison. Furthermore, in response to one or more clock signals from clock generator 140, SAR logic 130 receives the output from the comparator 120, and determines whether a next digital input word for CDAC 110 should be generated.

In some embodiments, in may be beneficial to determine whether the analog input voltage Vin is greater than or is less than the reference voltage Vref. In such embodiments, the comparison used to determine the MSB may be used as an indication of whether the analog input voltage Vin is greater than or is less than the reference voltage Vref.

In some embodiments, SAR logic 130 uses the information regarding whether the analog input voltage Vin is greater than or is less than the reference voltage Vref to determine a next digital input word for CDAC 110. For example, SAR logic 130 may use the information regarding whether the analog input voltage Vin is greater than or is less than the reference voltage Vref to determine whether each next Vcomp should be greater than the analog input voltage Vin or should be less than the analog input voltage Vin.

If sufficient digital input words for CDAC 110 have been generated and corresponding comparison results has been received by SAR logic 130, SAR logic 130 determines that the digital output word may be generated and provided to output Dout. If sufficient digital input words for CDAC 110 and corresponding comparison results has been received by SAR logic 130, SAR logic 130 generates a next digital input port for CDAC 110.

SAR logic 130 may include circuitry configured to implement any of a number of SAR calculations. For example, SAR logic 130 may include circuitry configured to implement either a linear or a binary SAR calculation, as understood by those of ordinary skill in the art. The circuitry of SAR logic 130 may be designed and built using processes known to those of skill in the art.

Figure 2:
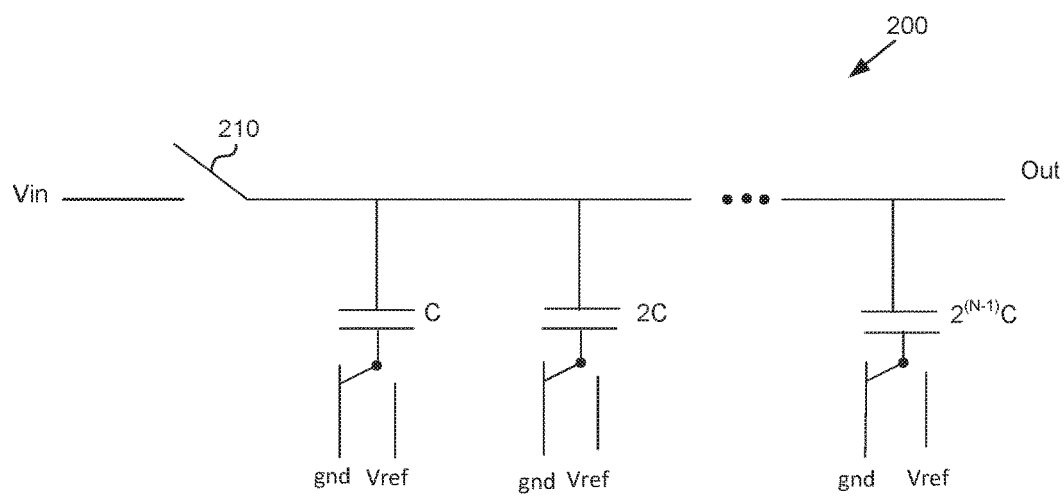
FIG. 2 is a schematic illustration of an embodiment of a CDAC which may be used in the SAR ADC of FIG. 1.

FIG. 2 is a schematic illustration of an embodiment of a CDAC 200 which may be used in the SAR ADC of FIG. 1. CDAC 200 includes switch 210 and an array of capacitors. The capacitors are by binarily waited, such that capacitors having values C, 2×C, 4×C, $2^{(N-1)}$×C are included, where N is equal to the number of bits of resolution of CDAC 200. Each of the capacitors is connected to a switch configured to selectively connect the capacitor to either a ground voltage or a reference voltage Vref.

When used in the SAR ADC 100 illustrated in FIG. 1 to determine the MSB of the digital output word, switch 210 is closed such that the analog input voltage Vin is provided to comparator 120 as voltage Vcomp. In addition, while comparator 120 compares voltage Vcomp with reference voltage Vref, the switches connected to each of the capacitors are each connected to either the ground voltage or the reference voltage Vref, and are not changed during the comparison.

When used in the SAR ADC 100 illustrated in FIG. 1 to determine each of the other bits of the digital output word, during a first period, the output node out is charged to analog input voltage Vin through conducting switch 210 while the switches connected to each of the capacitors are each connected to either the ground voltage or the reference voltage Vref, and during a second period, switch 210 is opened and one or more of the switches are switched, such that the one or more capacitors connected to the one or more switches are then connected to the other of the ground voltage or the reference voltage.

For example, during the first period the output node may be charged to analog input voltage Vin through the switch 210, which is closed. Additionally, during the first period, the switch connected to the capacitor having weight C is connected to the ground voltage. Subsequently, during the second period, switch 210 is opened, and the switch connected to the capacitor having weight C is switched so as to be connected to the reference voltage Vref. As a result, the voltage at the output node out is increased from the analog input voltage Vin by an amount corresponding with the charge stored on the capacitor having weight C.

In some embodiments, CDAC 120 includes a sample and hold amplifier between the analog input and switch 210. When present, the sample and hold amplifier samples the analog input voltage Vin, stores the sample voltage, for example, using a capacitor, and drives the switch 210 with a voltage substantially equal to the stored voltage. Sample and hold amplifiers known to those of skill in the art may be used.

Similarly, in some embodiments, SAR ADC 100 may include a sample and hold amplifier between the analog input and CDAC 120. When present, the sample and hold amplifier samples the analog input voltage Vin, stores the sample voltage, for example, using a capacitor, and drives CDAC 120 with a voltage substantially equal to the stored voltage. Sample and hold amplifiers known to those of skill in the art may be used.

As another example, during the first period the output node may be charged to analog input voltage Vin through the switch 210, which is closed. Additionally, during the first period, the switch connected to the capacitor having weight C is connected to the reference voltage Vref. Subsequently, during the second period, switch 210 is opened, and the switch connected to the capacitor having weight C is switched so as to be connected to the ground voltage. As a result, the voltage at the output node out is decreased from the analog input voltage Vin by an amount corresponding with the charge stored on the capacitor having weight C.

Figure 3:
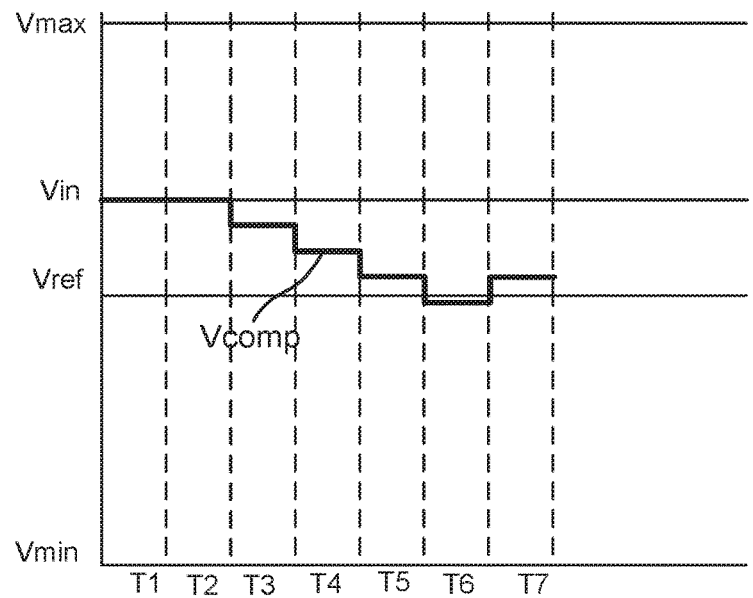
FIG. 3 is a waveform diagram illustrating operation of the SAR ADC of FIG. 1.

FIG. 3 is a waveform diagram illustrating operation of an embodiment of an SAR ADC, such as the SAR ADC 100 of FIG. 1. As shown, analog input voltage Vin is greater than a reference voltage Vref and is less than the maximum analog input voltage Vmax. In addition, as shown, reference voltage Vref is substantially equal to half the difference between maximum analog input voltage Vmax and minimum analog input voltage Vmin.

In the example illustrated in FIG. 3, the SAR ADC uses a linear search SAR method. As understood by those of skill in the art, other SAR methods, such as a binary search, may be used.

During the time period T1, CDAC 110 causes voltage Vcomp to be equal to or substantially equal to the analog voltage Vin, and comparator 120 generates a comparison value indicating that the analog voltage Vin is greater than the reference voltage Vref. In addition, based on the comparison value, SAR logic 130 determines the MSB of the digital output, and determines that subsequent values of voltage Vcomp will be less than the analog input value Vin.

During the time period T2, as a result of a digital input word from SAR logic 130, CDAC 110 causes voltage Vcomp to be equal to or substantially equal to the previous voltage Vcomp, comparator 120 generates a comparison value indicating that the voltage Vcomp is greater than the voltage Vref as a result of the voltage Vcomp being greater than the voltage Vref, and SAR logic 130 determines that the next Vcomp is to be less than the current Vcomp as a result of the voltage Vcomp being greater than the voltage Vref.

In alternative embodiments, during time period T2, as a result of a next digital input word from SAR logic 130, CDAC 110 causes voltage Vcomp to be equal to or substantially equal to the previous voltage Vcomp, minus a voltage step, where the magnitude of the voltage step corresponds with the charge of the capacitor of CDAC 110 having value C. In such embodiments, the operation of comparator 120 and SAR logic 130 remains unchanged.

During the time period T3, as a result of a next digital input word from SAR logic 130, CDAC 110 causes voltage Vcomp to be equal to or substantially equal to the previous voltage Vcomp, minus a voltage step, where the magnitude of the voltage step corresponds with the charge of the capacitor of CDAC 110 having value C. In addition, during time period T3, comparator 120 generates a comparison value indicating that the voltage Vcomp is greater than the voltage Vref as a result of the voltage Vcomp being greater than the voltage Vref, and SAR logic 130 determines that the next Vcomp is to be less than the current Vcomp as a result of the voltage Vcomp being greater than the voltage Vref.

During the time period T4, as a result of a next digital input word from SAR logic 130, CDAC 110 causes voltage Vcomp to be equal to or substantially equal to the previous voltage Vcomp, minus a voltage step, where the magnitude of the voltage step corresponds with the charge of the capacitor of CDAC 110 having value C. In addition, during time period T4, comparator 120 generates a comparison value indicating that the voltage Vcomp is greater than the voltage Vref as a result of the voltage Vcomp being greater than the voltage Vref, and SAR logic 130 determines that the next Vcomp is to be less than the current Vcomp as a result of the voltage Vcomp being greater than the voltage Vref.

During the time period T5, as a result of a next digital input word from SAR logic 130, CDAC 110 causes voltage Vcomp to be equal to or substantially equal to the previous voltage Vcomp, minus a voltage step, where the magnitude of the voltage step corresponds with the charge of the capacitor of CDAC 110 having value C. In addition, during time period T5, comparator 120 generates a comparison value indicating that the voltage Vcomp is greater than the voltage Vref as a result of the voltage Vcomp being greater than the voltage Vref, and SAR logic 130 determines that the next Vcomp is to be less than the current Vcomp as a result of the voltage Vcomp being greater than the voltage Vref.

During the time period T6, as a result of a next digital input word from SAR logic 130, CDAC 110 causes voltage Vcomp to be equal to or substantially equal to the previous voltage Vcomp, minus a voltage step, where the magnitude of the voltage step corresponds with the charge of the capacitor of CDAC 110 having value C. In addition, during time period T6, comparator 120 generates a comparison value indicating that the voltage Vcomp is less than the voltage Vref as a result of the voltage Vcomp being less than the voltage Vref, and SAR logic 130 determines that the next Vcomp is to be greater than the current Vcomp as a result of the voltage Vcomp being less than the voltage Vref.

In some embodiments, because all the information for determining the digital output word is available after time period T6, the SAR logic 130 determines the digital output word according to principles and aspects discussed elsewhere herein and/or otherwise known to those of skill in the art.

In the exemplary embodiment of FIG. 3, during the time period T7, as a result of a next digital input word from SAR logic 130, CDAC 110 causes voltage Vcomp to be equal to or substantially equal to the previous voltage Vcomp, plus a voltage step, where the magnitude of the voltage step corresponds with the charge of the capacitor of CDAC 110 having value C.

As a result of the voltage Vcomp being less than the voltage Vref during time period T6, the SAR logic 130 generates the digital output word corresponding to the analog input voltage Vin.

Because analog input voltage Vin was determined to be greater than the reference voltage Vref during time period T1, the MSB of the digital output word corresponds with that determination. In addition, because the digital input word from SAR logic 130 for CDAC 110 of time period T7 corresponds with the voltage difference between the reference voltage Vref and analog input voltage Vin, and the bits of the digital output word other than the MSB also correspond with the voltage difference between the reference voltage Vref and analog input voltage Vin, the digital input word from SAR logic 130 for CDAC 110 of time period T7 corresponds with the bits of the digital output word other than the MSB.

For example, if, in the example of FIG. 3, the maximum input voltage Vmax is 1 V, and the analog input voltage Vin is 0.74 V, a 4-bit digital word corresponding to the analog input voltage, may be 1011. The value of 1 for the MSB is determined during time period T1. In addition, because the digital input word from SAR logic 130 for CDAC 110 of time period T6 causes the voltage Vcomp to be equal to or substantially equal to the analog input voltage Vin, minus four voltage steps, where the magnitude of the voltage steps each correspond with the charge of the capacitor of CDAC 110 having value C, the other bits of the digital output word correspond with a voltage difference between the analog input voltage Vin and the reference voltage Vref, which corresponds digitally to 100. Accordingly, the digital output word is determined to be the expected 1011 because 0111+0100=1011, where 0111 represents the digitized value of the analog input voltage Vin minus four times the voltage corresponding with the charge of the capacitor of CDAC 110 having value C.

Once determined, the SAR ADC 100 represents the digital output word on the output Dout.

Figure 4:
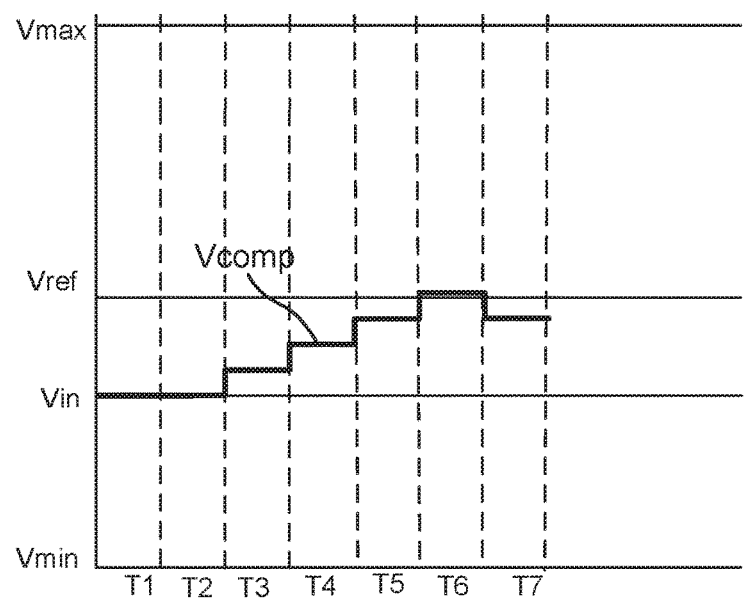
FIG. 4 is a waveform diagram illustrating operation of the SAR ADC of FIG. 1.

FIG. 4 is a waveform diagram illustrating operation of an embodiment of an SAR ADC, such as the SAR ADC 100 of FIG. 1. As shown, analog input voltage Vin is less than a reference voltage Vref and is less than the maximum analog input voltage Vmax. In addition, as shown, reference voltage Vref is substantially equal to half the difference between maximum analog input voltage Vmax and minimum analog input voltage Vmin.

In the example illustrated in FIG. 4, the SAR ADC uses a linear search SAR method. As understood by those of skill in the art, other SAR methods, such as a binary search, may be used.

During the time period T1, CDAC 110 causes voltage Vcomp to be equal to or substantially equal to the analog voltage Vin, and comparator 120 generates a comparison value indicating that the analog voltage Vin is less than the reference voltage Vref. In addition, based on the comparison value, SAR logic 130 determines the MSB of the digital output, and determines that subsequent values of voltage Vcomp will be greater than the analog input value Vin.

During the time period T2, as a result of a digital input word from SAR logic 130, CDAC 110 causes voltage Vcomp to be equal to or substantially equal to the previous voltage Vcomp, comparator 120 generates a comparison value indicating that the voltage Vcomp is less than the voltage Vref as a result of the voltage Vcomp being less than the voltage Vref, and SAR logic 130 determines that the next Vcomp is to be greater than the current Vcomp as a result of the voltage Vcomp being less than the voltage Vref.

In alternative embodiments, during time period T2, as a result of a next digital input word from SAR logic 130, CDAC 110 causes voltage Vcomp to be equal to or substantially equal to the previous voltage Vcomp, plus a voltage step, where the magnitude of the voltage step corresponds with the charge of the capacitor of CDAC 110 having value C. In such embodiments, the operation of comparator 120 and SAR logic 130 remains unchanged.

During the time period T3, as a result of a next digital input word from SAR logic 130, CDAC 110 causes voltage Vcomp to be equal to or substantially equal to the previous voltage Vcomp, plus a voltage step, where the magnitude of the voltage step corresponds with the charge of the capacitor of CDAC 110 having value C. In addition, during time period T3, comparator 120 generates a comparison value indicating that the voltage Vcomp is less than the voltage Vref as a result of the voltage Vcomp being less than the voltage Vref, and SAR logic 130 determines that the next Vcomp is to be greater than the current Vcomp as a result of the voltage Vcomp being less than the voltage Vref.

During the time period T4, as a result of a next digital input word from SAR logic 130, CDAC 110 causes voltage Vcomp to be equal to or substantially equal to the previous voltage Vcomp, plus a voltage step, where the magnitude of the voltage step corresponds with the charge of the capacitor of CDAC 110 having value C. In addition, during time period T4, comparator 120 generates a comparison value indicating that the voltage Vcomp is less than the voltage Vref as a result of the voltage Vcomp being less than the voltage Vref, and SAR logic 130 determines that the next Vcomp is to be greater than the current Vcomp as a result of the voltage Vcomp being greater than the voltage Vref.

During the time period T5, as a result of a next digital input word from SAR logic 130, CDAC 110 causes voltage Vcomp to be equal to or substantially equal to the previous voltage Vcomp, plus a voltage step, where the magnitude of the voltage step corresponds with the charge of the capacitor of CDAC 110 having value C. In addition, during time period T5, comparator 120 generates a comparison value indicating that the voltage Vcomp is less than the voltage Vref as a result of the voltage Vcomp being less than the voltage Vref, and SAR logic 130 determines that the next Vcomp is to be greater than the current Vcomp as a result of the voltage Vcomp being less than the voltage Vref.

During the time period T6, as a result of a next digital input word from SAR logic 130, CDAC 110 causes voltage Vcomp to be equal to or substantially equal to the previous voltage Vcomp, plus a voltage step, where the magnitude of the voltage step corresponds with the charge of the capacitor of CDAC 110 having value C. In addition, during time period T6, comparator 120 generates a comparison value indicating that the voltage Vcomp is greater than the voltage Vref as a result of the voltage Vcomp being greater than the voltage Vref, and SAR logic 130 determines that the next Vcomp is to be less than the current Vcomp as a result of the voltage Vcomp being greater than the voltage Vref.

In some embodiments, because all the information for determining the digital output word is available after time period T6, the SAR logic 130 determines the digital output word according to principles and aspects discussed elsewhere herein and/or otherwise known to those of skill in the art.

In the exemplary embodiment of FIG. 4, during the time period T7, as a result of a next digital input word from SAR logic 130, CDAC 110 causes voltage Vcomp to be equal to or substantially equal to the previous voltage Vcomp, minus a voltage step, where the magnitude of the voltage step corresponds with the charge of the capacitor of CDAC 110 having value C. The digital input word from SAR logic 130 for CDAC 110 of time period T7 corresponds with the voltage difference between the reference voltage Vref and analog input voltage Vin.

As a result of the voltage Vcomp being greater than the voltage Vref during time period T6, the SAR logic 130 generates the digital output word corresponding to the analog input voltage Vin.

Because analog input voltage Vin was determined to be less than the reference voltage Vref during time period T1, the MSB of the digital output word corresponds with that determination. In addition, because the digital input word from SAR logic 130 for CDAC 110 of time period T7 corresponds with the voltage difference between the reference voltage Vref and analog input voltage Vin, and the bits of the digital output word other than the MSB also correspond with the voltage difference between the reference voltage Vref and analog input voltage Vin, the digital input word from SAR logic 130 for CDAC 110 of time period T7 corresponds with the bits of the digital output word other than the MSB.

For example, if, in the example of FIG. 4, the maximum input voltage Vmax is 1 V, and the analog input voltage Vin is 0.26 V, a 4-bit digital word corresponding to the analog input voltage, may be 0100. The value of 0 for the MSB is determined during time period T1. In addition, because the digital input word from SAR logic 130 for CDAC 110 of time period T6 causes the voltage Vcomp to be equal to or substantially equal to the analog input voltage Vin, plus four voltage steps, where the magnitude of the voltage steps each correspond with the charge of the capacitor of CDAC 110 having value C, the other bits of the digital output word correspond with a voltage difference between the analog input voltage Vin and the reference voltage Vref, which corresponds digitally to 100. Accordingly, the digital output word is determined to be the expected 0100 because 1000−0100=0100, where 1000 represents the digitized value of the analog input voltage Vin plus four times the voltage corresponding with the charge of the capacitor of CDAC 110 having value C.

Once determined, the SAR ADC 100 represents the digital output word on the output Dout.

As discussed above, the digital input word for CDAC 110 during time period T2 depends on the result of the comparison of analog input voltage Vin with the reference voltage Vref during time period T1. For example, if during time period T1, the analog input voltage Vin is determined to be greater than the reference voltage Vref, the digital input word for CDAC 110 during time period T2 is all 1's so that during subsequent time periods, the appropriate amount of charge can be removed to reduce the voltage Vcomp toward the reference voltage Vref by selectively changing the 1's to 0's, as discussed above. Similarly, if during time period T1, the analog input voltage Vin is determined to be less than the reference voltage Vref, the digital input word for CDAC 110 during time period T2 is all 0's so that during subsequent time periods, the appropriate amount of charge can be added to increase the voltage Vcomp toward the reference voltage Vref by selectively changing the 0's to 1's, as discussed above.

In some embodiments, if, during time period T1, the analog input voltage Vin is determined to be greater than the reference voltage Vref, the digital input word for CDAC 110 during time period T2 includes one or more bits set to 0 (with the remaining bits being set to 1). As a result, during time period T2, the one or more bits equal to 0 can be changed to 1 to add a predetermined voltage to the analog input voltage Vin when the voltage Vcomp is generated.

Adding the predetermined voltage to the analog input voltage Vin ensures that the voltage Vcomp during time period T2 is greater than the reference voltage Vref, even if the analog input voltage Vin were to decrease between time period T1 and time period T2. This is advantageous at least because the analog input voltage Vin being greater than the reference voltage Vref during time period T1 causes the SAR logic 130 to generate digital input words for CDAC 110 which cause voltage Vcomp to successively approach the reference voltage Vref starting from a value greater than the reference voltage Vref. Because the predetermined voltage value is determined so that, based on the maximum frequency of the analog input signal and on the time duration of the time periods, the voltage Vcomp is greater than the reference voltage Vref during time period T2. If the voltage Vcomp were allowed to be less than the reference voltage Vref during time period T2, the SAR algorithm could fail.

Similarly, if, during time period T1, the analog input voltage Vin is determined to be less than the reference voltage Vref, the digital input word for CDAC 110 during time period T2 includes one or more bits set to 1 (with the remaining bits being set to 0). As a result, during time period T2, the one or more bits equal to 1 can be changed to 0 to subtract a predetermined voltage from the analog input voltage Vin when the voltage Vcomp is generated. Subtracting the predetermined voltage from the analog input voltage Vin ensures that the voltage Vcomp during time period T2 is less than the reference voltage Vref, even if the analog input voltage Vin were to increase between time period T1 and time period T2. This is advantageous at least because the analog input voltage Vin being less than the reference voltage Vref during time period T1 causes the SAR logic 130 to generate digital input words for CDAC 110 which cause voltage Vcomp to successively approach the reference voltage Vref starting from a value less than the reference voltage Vref. Because the predetermined voltage value is determined so that, based on the maximum frequency of the analog input signal and on the time duration of the time periods, the voltage Vcomp is less than the reference voltage Vref during time period T2. If the voltage Vcomp were allowed to be greater than the reference voltage Vref during time period T2, the SAR algorithm could fail.

Figure 5:
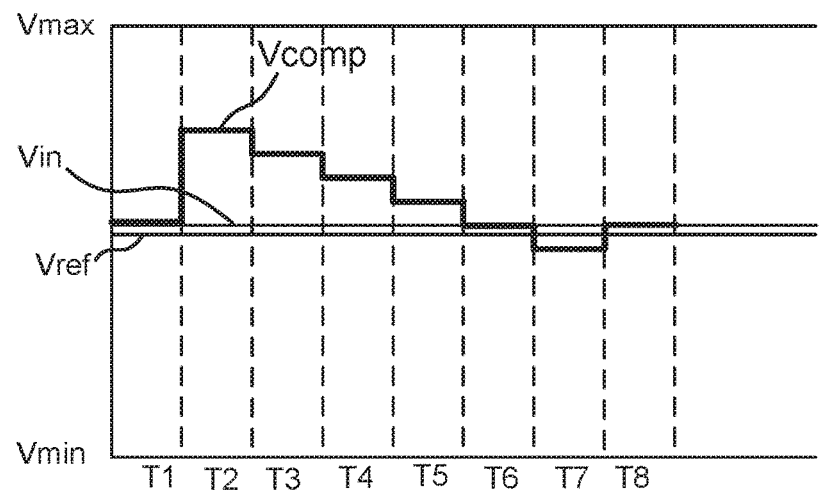
FIG. 5 is a waveform diagram illustrating alternative operation of the SAR ADC of FIG. 1.

FIG. 5 is a waveform diagram illustrating operation of an embodiment of an SAR ADC, such as the SAR ADC 100 of FIG. 1. As shown, analog input voltage Vin is greater than a reference voltage Vref and is less than the maximum analog input voltage Vmax. In addition, reference voltage Vref is substantially equal to half the difference between maximum analog input voltage Vmax and minimum analog input voltage Vmin.

In the example illustrated in FIG. 5, the SAR ADC uses a linear search SAR method. As understood by those of skill in the art, other SAR methods, such as a binary search, may be used.

During the time period T1, CDAC 110 causes voltage Vcomp to be equal to or substantially equal to the analog voltage Vin, and comparator 120 generates a comparison value indicating that the analog voltage Vin is greater than the reference voltage Vref. In addition, based on the comparison value, SAR logic 130 determines the MSB of the digital output, and determines that subsequent values of voltage Vcomp will be equal to or less than the analog input value Vin plus a predetermined voltage value.

During the time period T2, as a result of a digital input word from SAR logic 130, CDAC 110 causes voltage Vcomp to be equal to or substantially equal to the analog input value Vin of time period T2 plus the predetermined voltage value by sampling the analog input value Vin during time period T2 with one or more bits of the digital input word for CDAC 110 equal to 0, and subsequently changing those bits to 1, where the changed bits correspond with the capacitors of the CDAC 110 which, in response to the bits changing from 0 to 1, inject charge onto the Vcomp node causing the voltage at the Vcomp node to increase by the predetermined voltage value. Comparator 120 generates a comparison value indicating that the voltage Vcomp is greater than the voltage Vref as a result of the voltage Vcomp being greater than the voltage Vref, and SAR logic 130 determines that the next Vcomp is to be less than the current Vcomp as a result of the voltage Vcomp being greater than the voltage Vref.

During the time period T3, as a result of a next digital input word from SAR logic 130, CDAC 110 causes voltage Vcomp to be equal to or substantially equal to the previous voltage Vcomp, minus a voltage step, where the magnitude of the voltage step corresponds with the charge of the capacitor of CDAC 110 having value C. In addition, during time period T3, comparator 120 generates a comparison value indicating that the voltage Vcomp is greater than the voltage Vref as a result of the voltage Vcomp being greater than the voltage Vref, and SAR logic 130 determines that the next Vcomp is to be less than the current Vcomp as a result of the voltage Vcomp being greater than the voltage Vref.

During the time period T4, as a result of a next digital input word from SAR logic 130, CDAC 110 causes voltage Vcomp to be equal to or substantially equal to the previous voltage Vcomp, minus a voltage step, where the magnitude of the voltage step corresponds with the charge of the capacitor of CDAC 110 having value C. In addition, during time period T4, comparator 120 generates a comparison value indicating that the voltage Vcomp is greater than the voltage Vref as a result of the voltage Vcomp being greater than the voltage Vref, and SAR logic 130 determines that the next Vcomp is to be less than the current Vcomp as a result of the voltage Vcomp being greater than the voltage Vref.

During the time period T5, as a result of a next digital input word from SAR logic 130, CDAC 110 causes voltage Vcomp to be equal to or substantially equal to the previous voltage Vcomp, minus a voltage step, where the magnitude of the voltage step corresponds with the charge of the capacitor of CDAC 110 having value C. In addition, during time period T5, comparator 120 generates a comparison value indicating that the voltage Vcomp is greater than the voltage Vref as a result of the voltage Vcomp being greater than the voltage Vref, and SAR logic 130 determines that the next Vcomp is to be less than the current Vcomp as a result of the voltage Vcomp being greater than the voltage Vref.

During the time period T6, as a result of a next digital input word from SAR logic 130, CDAC 110 causes voltage Vcomp to be equal to or substantially equal to the previous voltage Vcomp, minus a voltage step, where the magnitude of the voltage step corresponds with the charge of the capacitor of CDAC 110 having value C. In addition, during time period T6, comparator 120 generates a comparison value indicating that the voltage Vcomp is greater than the voltage Vref as a result of the voltage Vcomp being greater than the voltage Vref, and SAR logic 130 determines that the next Vcomp is to be less than the current Vcomp as a result of the voltage Vcomp being greater than the voltage Vref.

During the time period T7, as a result of a next digital input word from SAR logic 130, CDAC 110 causes voltage Vcomp to be equal to or substantially equal to the previous voltage Vcomp, minus a voltage step, where the magnitude of the voltage step corresponds with the charge of the capacitor of CDAC 110 having value C. In addition, during time period T7, comparator 120 generates a comparison value indicating that the voltage Vcomp is less than the voltage Vref as a result of the voltage Vcomp being less than the voltage Vref, and SAR logic 130 determines that the next Vcomp is to be greater than the current Vcomp as a result of the voltage Vcomp being less than the voltage Vref.

In some embodiments, because all the information for determining the digital output word is available after time period T7, the SAR logic 130 determines the digital output word according to principles and aspects discussed elsewhere herein and/or otherwise known to those of skill in the art.

In the exemplary embodiment of FIG. 5, during the time period T8, as a result of a next digital input word from SAR logic 130, CDAC 110 causes voltage Vcomp to be equal to or substantially equal to the previous voltage Vcomp, plus a voltage step, where the magnitude of the voltage step corresponds with the charge of the capacitor of CDAC 110 having value C.

As a result of the voltage Vcomp being less than the voltage Vref during time period T7, the SAR logic 130 generates the digital output word corresponding to the analog input voltage Vin.

Because analog input voltage Vin was determined to be greater than the reference voltage Vref during time period T1, the MSB of the digital output word corresponds with that determination. In addition, because the digital input word from SAR logic 130 for CDAC 110 of time period T8 corresponds with the voltage difference between the reference voltage Vref and the analog input voltage Vin plus the predetermined voltage, and the bits of the digital output word other than the MSB also correspond with the voltage difference between the reference voltage Vref and analog input voltage Vin plus the predetermined voltage, the digital input word from SAR logic 130 for CDAC 110 of time period T8 minus a digital representation of the predetermined voltage corresponds with the bits of the digital output word other than the MSB.

For example, if, in the example of FIG. 5, the maximum input voltage Vmax is 1 V, and the analog input voltage Vin is 0.54 V, a 4-bit digital word corresponding to the analog input voltage, may be 1000. The value of 1 for the MSB is determined during time period T1. During time period T2, a predetermined voltage of 0.25 volts is added to the analog input voltage value, such that Vcomp is 0.79 V. In addition, because the digital input word from SAR logic 130 for CDAC 110 of time period T8 causes the voltage Vcomp to be equal to or substantially equal to the analog input voltage Vin plus the predetermined voltage value minus four voltage steps, where the magnitude of the voltage steps each correspond with the charge of the capacitor of CDAC 110 having value C, the other bits of the digital output word correspond with a voltage difference between the analog input voltage Vin plus the predetermined voltage value and the reference voltage Vref, which corresponds digitally to 100. Accordingly, the digital output word is determined to be the expected 1000 because 1000 (minimum value for Vin>Vref, as determined during time period T1)+0100 (four voltage steps from SAR algorithm, as determined during time period T6 and/or T8)−0100 (digital representation of predetermined voltage value)=1000, where 1000 is the digitized value of the analog input voltage Vin.

Once determined, the SAR ADC 100 represents the digital output word on the output Dout.

Figure 6:
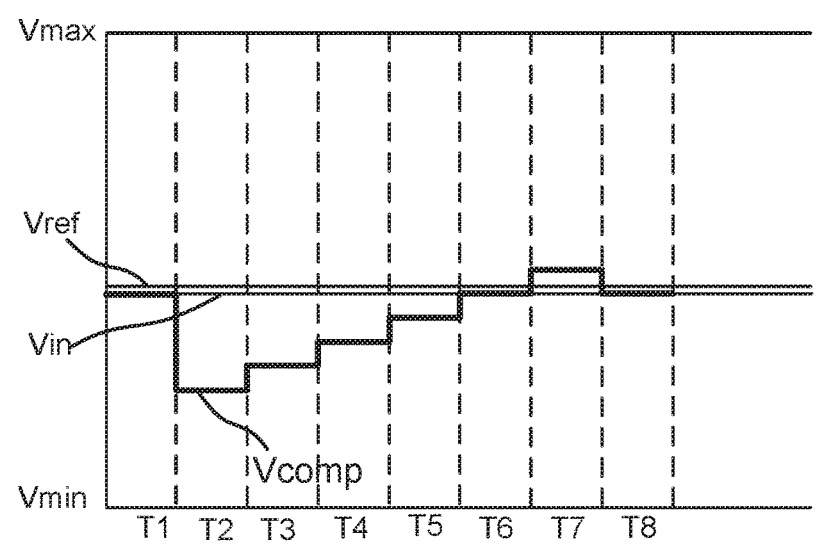
FIG. 6 is a waveform diagram illustrating alternative operation of the SAR ADC of FIG. 1.

FIG. 6 is a waveform diagram illustrating operation of an embodiment of an SAR ADC, such as the SAR ADC 100 of FIG. 1. As shown, analog input voltage Vin is less than a reference voltage Vref and is greater than the minimum analog input voltage Vmin. In addition, reference voltage Vref is substantially equal to half the difference between maximum analog input voltage Vmax and minimum analog input voltage Vmin.

In the example illustrated in FIG. 6, the SAR ADC uses a linear search SAR method. As understood by those of skill in the art, other SAR methods, such as a binary search, may be used.

During the time period T1, CDAC 110 causes voltage Vcomp to be equal to or substantially equal to the analog voltage Vin, and comparator 120 generates a comparison value indicating that the analog voltage Vin is less than the reference voltage Vref. In addition, based on the comparison value, SAR logic 130 determines the MSB of the digital output, and determines that subsequent values of voltage Vcomp will be equal to or greater than the analog input value Vin minus a predetermined voltage value.

During the time period T2, as a result of a digital input word from SAR logic 130, CDAC 110 causes voltage Vcomp to be equal to or substantially equal to the analog input value Vin of time period T2 minus the predetermined voltage value by sampling the analog input value Vin during time period T2 with one or more bits of the digital input word for CDAC 110 equal to 1, and subsequently changing those bits to 0, where the changed bits correspond with the capacitors of the CDAC 110 which, in response to the bits changing from 1 to 0, inject (or remove) charge onto (or from) the Vcomp node causing the voltage at the Vcomp node to decrease by the predetermined voltage value. Comparator 120 generates a comparison value indicating that the voltage Vcomp is less than the voltage Vref as a result of the voltage Vcomp being less than the voltage Vref, and SAR logic 130 determines that the next Vcomp is to be greater than the current Vcomp as a result of the voltage Vcomp being less than the voltage Vref.

During the time period T3, as a result of a next digital input word from SAR logic 130, CDAC 110 causes voltage Vcomp to be equal to or substantially equal to the previous voltage Vcomp, plus a voltage step, where the magnitude of the voltage step corresponds with the charge of the capacitor of CDAC 110 having value C. In addition, during time period T3, comparator 120 generates a comparison value indicating that the voltage Vcomp is less than the voltage Vref as a result of the voltage Vcomp being less than the voltage Vref, and SAR logic 130 determines that the next Vcomp is to be greater than the current Vcomp as a result of the voltage Vcomp being less than the voltage Vref.

During the time period T4, as a result of a next digital input word from SAR logic 130, CDAC 110 causes voltage Vcomp to be equal to or substantially equal to the previous voltage Vcomp, plus a voltage step, where the magnitude of the voltage step corresponds with the charge of the capacitor of CDAC 110 having value C. In addition, during time period T4, comparator 120 generates a comparison value indicating that the voltage Vcomp is less than the voltage Vref as a result of the voltage Vcomp being less than the voltage Vref, and SAR logic 130 determines that the next Vcomp is to be greater than the current Vcomp as a result of the voltage Vcomp being less than the voltage Vref.

During the time period T5, as a result of a next digital input word from SAR logic 130, CDAC 110 causes voltage Vcomp to be equal to or substantially equal to the previous voltage Vcomp, plus a voltage step, where the magnitude of the voltage step corresponds with the charge of the capacitor of CDAC 110 having value C. In addition, during time period T5, comparator 120 generates a comparison value indicating that the voltage Vcomp is less than the voltage Vref as a result of the voltage Vcomp being less than the voltage Vref, and SAR logic 130 determines that the next Vcomp is to be greater than the current Vcomp as a result of the voltage Vcomp being less than the voltage Vref.

During the time period T6, as a result of a next digital input word from SAR logic 130, CDAC 110 causes voltage Vcomp to be equal to or substantially equal to the previous voltage Vcomp, plus a voltage step, where the magnitude of the voltage step corresponds with the charge of the capacitor of CDAC 110 having value C. In addition, during time period T6, comparator 120 generates a comparison value indicating that the voltage Vcomp is less than the voltage Vref as a result of the voltage Vcomp being less than the voltage Vref, and SAR logic 130 determines that the next Vcomp is to be greater than the current Vcomp as a result of the voltage Vcomp being less than the voltage Vref.

During the time period T7, as a result of a next digital input word from SAR logic 130, CDAC 110 causes voltage Vcomp to be equal to or substantially equal to the previous voltage Vcomp, plus a voltage step, where the magnitude of the voltage step corresponds with the charge of the capacitor of CDAC 110 having value C. In addition, during time period T7, comparator 120 generates a comparison value indicating that the voltage Vcomp is greater than the voltage Vref as a result of the voltage Vcomp being greater than the voltage Vref, and SAR logic 130 determines that the next Vcomp is to be less than the current Vcomp as a result of the voltage Vcomp being greater than the voltage Vref.

In some embodiments, because all the information for determining the digital output word is available after time period T7, the SAR logic 130 determines the digital output word according to principles and aspects discussed elsewhere herein and/or otherwise known to those of skill in the art.

In the exemplary embodiment of FIG. 6, during the time period T8, as a result of a next digital input word from SAR logic 130, CDAC 110 causes voltage Vcomp to be equal to or substantially equal to the previous voltage Vcomp, minus a voltage step, where the magnitude of the voltage step corresponds with the charge of the capacitor of CDAC 110 having value C.

As a result of the voltage Vcomp being greater than the voltage Vref during time period T7, the SAR logic 130 generates the digital output word corresponding to the analog input voltage Vin.

Because analog input voltage Vin was determined to be less than the reference voltage Vref during time period T1, the MSB of the digital output word corresponds with that determination. In addition, because the digital input word from SAR logic 130 for CDAC 110 of time period T8 corresponds with the voltage difference between the reference voltage Vref and the analog input voltage Vin minus the predetermined voltage, and the bits of the digital output word other than the MSB also correspond with the voltage difference between the reference voltage Vref and analog input voltage Vin minus the predetermined voltage, the digital input word from SAR logic 130 for CDAC 110 of time period T8 plus a digital representation of the predetermined voltage corresponds with the bits of the digital output word other than the MSB.

For example, if, in the example of FIG. 6, the maximum input value Vmax is 1 V, and the analog input voltage Vin is 0.46 V, a 4-bit digital word corresponding to the analog input voltage, may be 0111. The value of 0 for the MSB is determined during time period T1. During time period T2, a predetermined voltage of 0.25 volts is subtracted from the analog input voltage value, such that Vcomp is 0.21 V. In addition, because the digital input word from SAR logic 130 for CDAC 110 of time period T8 causes the voltage Vcomp to be equal to or substantially equal to the analog input voltage Vin minus the predetermined voltage value plus four voltage steps, where the magnitude of the voltage steps each correspond with the charge of the capacitor of CDAC 110 having value C, the other bits of the digital output word correspond with a voltage difference between the analog input voltage Vin minus the predetermined voltage value and the reference voltage Vref, which corresponds digitally to 100. Accordingly, the digital output word is determined to be the expected 0111 because 0111 (maximum value for Vin<Vref, as determined during time period T1)−0100 (four voltage steps from SAR algorithm, as determined during time period T6 and/or T8)+0100 (digital representation of predetermined voltage value)=0111, where 0111 is the digitized value of the analog input voltage Vin.

Once determined, the SAR ADC 100 represents the digital output word on the output Dout.

Figure 7:
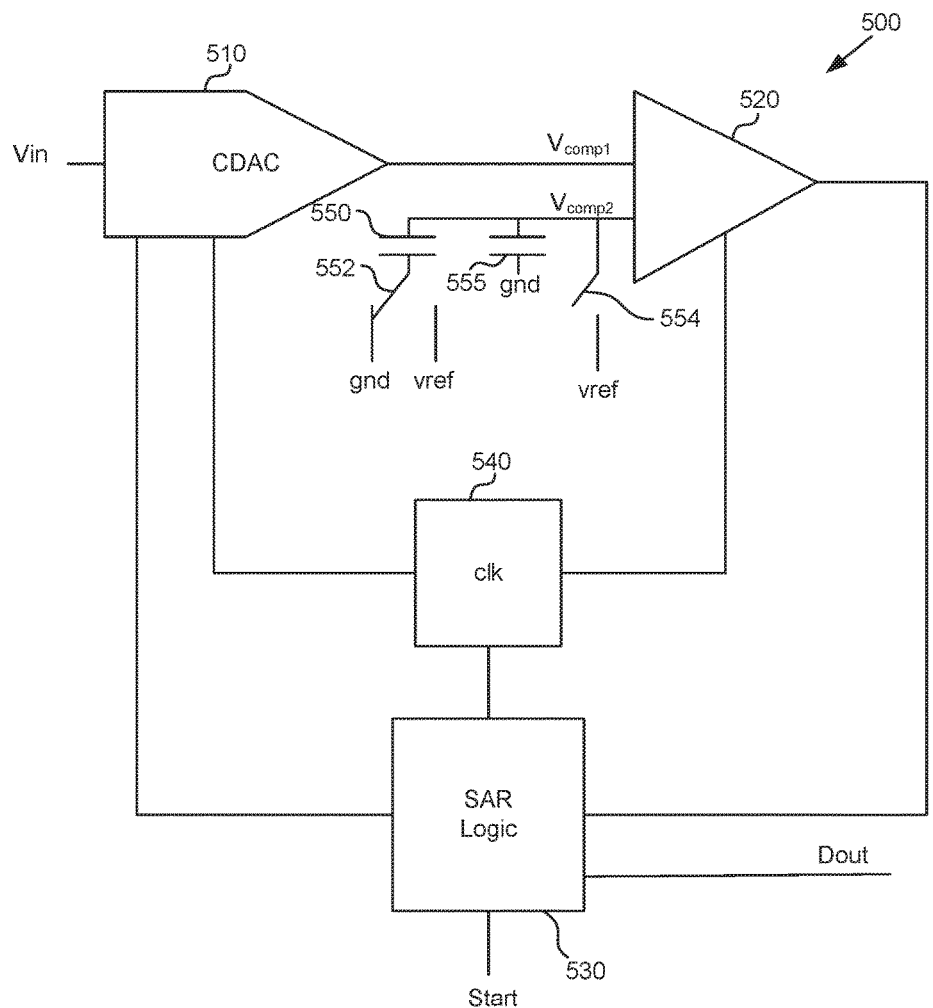
FIG. 7 is a schematic illustration of an SAR ADC according to an alternative embodiment.

FIG. 7 is a schematic illustration of an SAR ADC 500 according to one embodiment. SAR ADC 500 includes CDAC 510, comparator 520, SAR logic 530, and clock generator 540. In this embodiment, SAR ADC 500 also includes capacitors 550 and 555, and switches 552 and 554. Capacitors 550 and 555, and switches 552 and 554 collectively form a voltage reference generator configured to selectively generate one of three reference voltages, Vref, Vref plus a predetermined voltage, and Vref—the predetermined voltage value. The magnitude of the predetermined voltage value depends on the values of capacitors 550 and 555 according charge sharing principles understood by those of skill in the art. In alternative embodiments, other circuits may be used to selectively generate one of the three reference voltages. For example, a charge pump or a voltage doubler circuit may be used, as understood by those of skill in the art.

CDAC 510, comparator 520, SAR logic 530, and clock generator 540 may respectively be similar or identical to CDAC 110, comparator 120, SAR logic 130, and clock generator 140 of FIG. 1. Capacitors 550 and 555, and switches 552 and 554 collectively form a voltage generator configured to provide a voltage Vcomp2.

SAR ADC 500 receives an analog input value at Vin. In response to a start signal, SAR ADC 500 calculates and generates a digital value corresponding with the analog input value Vin. Once calculated, SAR ADC 500 provides the digital value as output word Dout.

To determine the digital value, SAR ADC 500 determines a most significant bit (MSB), and subsequently determines each of the other bits of the digital output word.

To determine the MSB, in response to one or more clock signals from clock generator 540, the analog input voltage Vin is provided to comparator 520 as voltage Vcomp1, and comparator 520 compares voltage Vcomp1 with voltage Vcomp2 and generates an output voltage corresponding with the results of the comparison. In addition, in response to one or more clock signals from clock generator 540, SAR logic 530 receives the output from the comparator 520, and determines and stores an MSB based on the output from the comparator 520.

While the analog input voltage Vin is provided to comparator 520, the switches of CDAC 510 (for example, see FIG. 2) may be connected to the gnd reference. In addition, SAR logic 530 may connect switch 552 to the gnd reference and may close switch 554 to be connected to the reference voltage Vref.

Alternatively, while the voltage Vin is provided to comparator 520, the switches of CDAC 510 (for example, see FIG. 2) may be connected to the reference voltage Vref. In addition, SAR logic 530 may connect switch 552 to the reference voltage Vref and may close switch 554 to be connected to the reference voltage Vref.

To determine each of the other bits of the digital output word, in response to each of one or more clock signals from clock generator 540, SAR logic 530 determines a next digital input word for CDAC 510, and CDAC 510 generates a next voltage Vcomp1. In addition, in response to each of one or more clock signals from clock generator 540, comparator 520 compares the next voltage Vcomp1 with reference Vcomp2 and generates an output voltage corresponding with the results of the comparison. Furthermore, in response to one or more clock signals from clock generator 540, SAR logic 530 receives the output from the comparator 520, and determines whether a next digital input word for CDAC 510 should be generated.

SAR logic 530 may use the information regarding whether the analog input voltage Vin is greater than or is less than the reference voltage Vref to determine a next digital input word for CDAC 510 during a subsequent sampling of the analog input voltage Vin. For example, SAR logic 530 may use the information regarding whether the analog input voltage Vin is greater than or is less than the reference voltage Vref to determine whether each next Vcomp1 should be greater than the analog input voltage Vin or should be less than the analog input voltage Vin.

In addition, SAR logic 530 may use the information regarding whether the analog input voltage Vin is greater than or is less than the reference voltage Vref to determine whether the predetermined voltage value should be added to the analog input voltage Vin or should be subtracted from the analog input voltage Vin after the subsequent sampling of the analog input voltage Vin. SAR logic 530 determines states for the switches of CDAC 510 and switches 552 and 554 during the subsequent sampling of the analog input voltage Vin based on whether the analog input voltage Vin was greater than or less than the reference voltage Vref while the voltage Vin was provided to comparator 520.

For example, in response to the analog input voltage Vin having been greater than the reference voltage Vref, SAR logic 530 causes the switches of CDAC 510 to be connected to the reference voltage Vref, switch 552 to be connected to the reference voltage Vref, and switch 554 to be closed during the subsequent sampling of the analog input voltage Vin. In addition, after the subsequent sampling of the analog input voltage Vin, SAR logic 530 causes switch 552 to be connected to the gnd reference voltage and the switch 554 to be opened, so that the predetermined voltage value is subtracted from the voltage at node Vcomp2.

Similarly, in response to the analog input voltage Vin having been less than the reference voltage Vref, SAR logic 530 causes the switches of CDAC 510 to be connected to the gnd reference voltage, switch 552 to be connected to the gnd reference voltage, and switch 554 to be closed during the subsequent sampling of the analog input voltage Vin. In addition, after the subsequent sampling of the analog input voltage Vin, SAR logic 530 causes switch 552 to be connected to the reference voltage Vref and the switch 554 to be opened, so that the predetermined voltage value is added to the voltage at node Vcomp2.

Once sufficient digital input words for CDAC 510 have been generated and corresponding comparison results have been received by SAR logic 530, SAR logic 530 determines that the digital output word may be generated and provided to output Dout, and does so. If sufficient digital input words for CDAC 510 and corresponding comparison results have been received by SAR logic 530, SAR logic 530 generates a next digital input port for CDAC 510.

SAR logic 530 may include circuitry configured to implement any of a number of SAR calculations. For example, SAR logic 530 may include circuitry configured to implement either a linear or a binary SAR calculation, as understood by those of ordinary skill in the art. The circuitry of SAR logic 530 may be designed and built using processes known to those of skill in the art.

Figure 8:
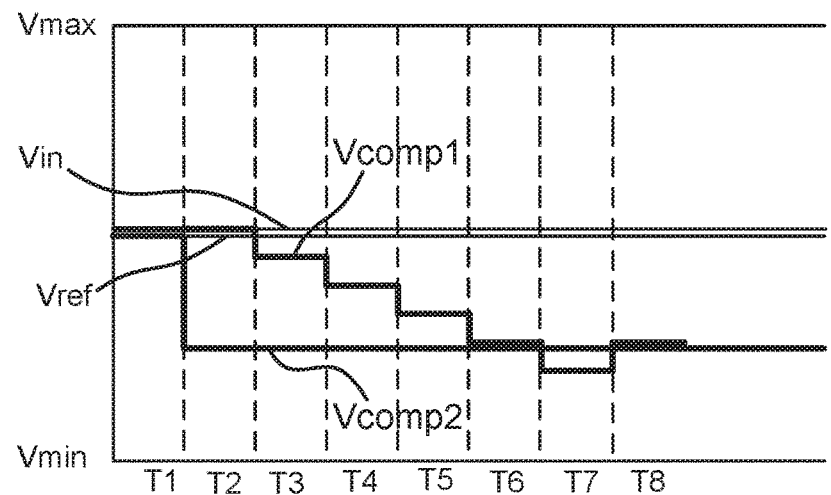
FIG. 8 is a waveform diagram illustrating operation of the SAR ADC of FIG. 7.

FIG. 8 is a waveform diagram illustrating operation of an embodiment of an SAR ADC, such as the SAR ADC 500 of FIG. 7. As shown, analog input voltage Vin is greater than a reference voltage Vref and is less than the maximum analog input voltage Vmax. In addition, as shown, reference voltage Vref is substantially equal to half the difference between maximum analog input voltage Vmax and minimum analog input voltage Vmin.

In the example illustrated in FIG. 8, the SAR ADC uses a linear search SAR method. As understood by those of skill in the art, other SAR methods, such as a binary search, may be used.

During the time period T1, the SAR logic 530 causes the switches of CDAC 510 and switch 552 to be connected either to the gnd reference or to the reference voltage Vref and causes switch 554 to be closed. In addition, CDAC 510 causes voltage Vcomp1 to be equal to or substantially equal to the analog voltage Vin. Further, comparator 520 generates a comparison value indicating that the analog voltage Vin is greater than the Vcomp2, which is equal to the reference voltage Vref. Also, based on the comparison value, SAR logic 530 determines the MSB of the digital output, determines that subsequent values of voltage Vcomp1 will be less than the analog input value, and determines that Vcomp2 will be equal to Vref minus a predetermined voltage.

During the time period T2, as a result of the analog voltage Vin being greater than the reference voltage during time period T1, SAR logic 530 causes the switches of CDAC 510 and switch 552 to be connected to the reference voltage Vref and causes switch 554 to be closed while the analog input voltage Vin is sampled such that the voltage at node Vcomp1 is substantially equal to the analog input voltage Vin. After the analog input voltage is sampled, the voltage at Vcomp2 is decreased by the predetermined voltage by causing switch 552 to be connected to the gnd reference voltage.

Also during the time period T2, comparator 520 generates a comparison value indicating that the voltage Vcomp1 is greater than the voltage Vcomp2 as a result of the voltage Vcomp1 being greater than the voltage at Vcomp2 (voltage Vref minus the predetermined voltage), and SAR logic 530 determines that the next Vcomp1 is to be less than the current Vcomp1 as a result of the voltage Vcomp1 being greater than the voltage Vref minus the predetermined voltage.

During the time period T3, as a result of a next digital input word from SAR logic 530, CDAC 510 causes voltage Vcomp1 to be equal to or substantially equal to the previous voltage Vcomp1 minus a voltage step, where the magnitude of the voltage step corresponds with the charge of the capacitor of CDAC 510 having value C. In addition, during time period T3, comparator 520 generates a comparison value indicating that the voltage Vcomp1 is greater than the voltage at Vcomp2 (voltage Vref minus the predetermined voltage), and SAR logic 530 determines that the next Vcomp1 is to be less than the current Vcomp1 as a result of the voltage Vcomp1 being greater than the voltage Vref minus the predetermined value.

During the time period T4, as a result of a next digital input word from SAR logic 530, CDAC 510 causes voltage Vcomp1 to be equal to or substantially equal to the previous voltage Vcomp1, minus a voltage step, where the magnitude of the voltage step corresponds with the charge of the capacitor of CDAC 510 having value C. In addition, during time period T4, comparator 520 generates a comparison value indicating that the voltage Vcomp1 is greater than the voltage at Vcomp2 (voltage Vref minus the predetermined voltage), and SAR logic 530 determines that the next Vcomp1 is to be less than the current Vcomp1 as a result of the voltage Vcomp1 being greater than the voltage Vref minus the predetermined value.

During the time period T5, as a result of a next digital input word from SAR logic 530, CDAC 510 causes voltage Vcomp1 to be equal to or substantially equal to the previous voltage Vcomp1, minus a voltage step, where the magnitude of the voltage step corresponds with the charge of the capacitor of CDAC 510 having value C. In addition, during time period T5, comparator 520 generates a comparison value indicating that the voltage Vcomp1 is greater than the voltage at Vcomp2 (voltage Vref minus the predetermined voltage), and SAR logic 530 determines that the next Vcomp1 is to be less than the current Vcomp1 as a result of the voltage Vcomp1 being greater than the voltage Vref minus the predetermined value.

During the time period T6, as a result of a next digital input word from SAR logic 530, CDAC 510 causes voltage Vcomp1 to be equal to or substantially equal to the previous voltage Vcomp1, minus a voltage step, where the magnitude of the voltage step corresponds with the charge of the capacitor of CDAC 510 having value C. In addition, during time period T6, comparator 520 generates a comparison value indicating that the voltage Vcomp1 is greater than the voltage Vcomp2 (voltage Vref minus the predetermined voltage), and SAR logic 530 determines that the next Vcomp1 is to be less than the current Vcomp1 as a result of the voltage Vcomp1 being greater than the voltage Vref minus the predetermined value.

During the time period T7, as a result of a next digital input word from SAR logic 530, CDAC 510 causes voltage Vcomp1 to be equal to or substantially equal to the previous voltage Vcomp1, minus a voltage step, where the magnitude of the voltage step corresponds with the charge of the capacitor of CDAC 510 having value C. In addition, during time period T7, comparator 520 generates a comparison value indicating that the voltage Vcomp1 is less than the voltage Vcomp2 (voltage Vref minus the predetermined voltage), and SAR logic 530 determines that the next Vcomp1 is to be greater than the current Vcomp1 as a result of the voltage Vcomp1 being less than the voltage Vref minus the predetermined value.

In some embodiments, because all the information for determining the digital output word is available after time period T7, the SAR logic 530 determines the digital output word according to principles and aspects discussed elsewhere herein and/or otherwise known to those of skill in the art.

In the exemplary embodiment of FIG. 8, during the time period T8, as a result of a next digital input word from SAR logic 530, CDAC 510 causes voltage Vcomp1 to be equal to or substantially equal to the previous voltage Vcomp1, plus a voltage step, where the magnitude of the voltage step corresponds with the charge of the capacitor of CDAC 510 having value C.

As a result of the voltage Vcomp1 being less than the voltage Vref minus the predetermined voltage during time period T7, the SAR logic 530 generates the digital output word corresponding to the analog input voltage Vin.

Because analog input voltage Vin was determined to be greater than the reference voltage Vref during time period T1, the MSB of the digital output word corresponds with that determination. In addition, because the digital input word from SAR logic 530 for CDAC 510 of time period T6 or T8 corresponds with the voltage difference between the reference voltage Vref minus the predetermined value and analog input voltage Vin, and the bits of the digital output word other than the MSB also correspond with the voltage difference between the reference voltage Vref minus the predetermined value and analog input voltage Vin, the digital input word from SAR logic 130 for CDAC 110 of time period T6 or T8 plus a digital representation of the predetermined voltage corresponds with the bits of the digital output word other than the MSB.

For example, if, in the example of FIG. 8, the maximum input voltage Vmax is 1 V, and the analog input voltage Vin is 0.54 V, a 4-bit digital word corresponding to the analog input voltage, may be 1000. The value of 1 for the MSB is determined during time period T1. During time period T2, a predetermined voltage of 0.25 volts is subtracted from voltage Vcomp2, such that Vcomp2 is 0.25 V. In addition, because the digital input word from SAR logic 130 for CDAC 110 of time period T6 or T8 causes the voltage Vcomp1 to be equal to or substantially equal to the analog input voltage Vin minus four voltage steps, where the magnitude of the voltage steps each correspond with the charge of the capacitor of CDAC 110 having value C, the other bits of the digital output word correspond with a voltage difference between the analog input voltage Vin and the reference voltage Vref minus the predetermined voltage value, which corresponds digitally to 100. Accordingly, the digital output word is determined to be the expected 1000 because 1000 (minimum value for Vin>Vref, as determined during time period T1)+0100 (four voltage steps from SAR algorithm, as determined during time period T6 and/or T8)−0100 (digital representation of predetermined voltage value)=1000, where 1000 represents the digitized value of the analog input voltage Vin.

Once determined, the SAR ADC 100 represents the digital output word on the output Dout.

Figure 9:
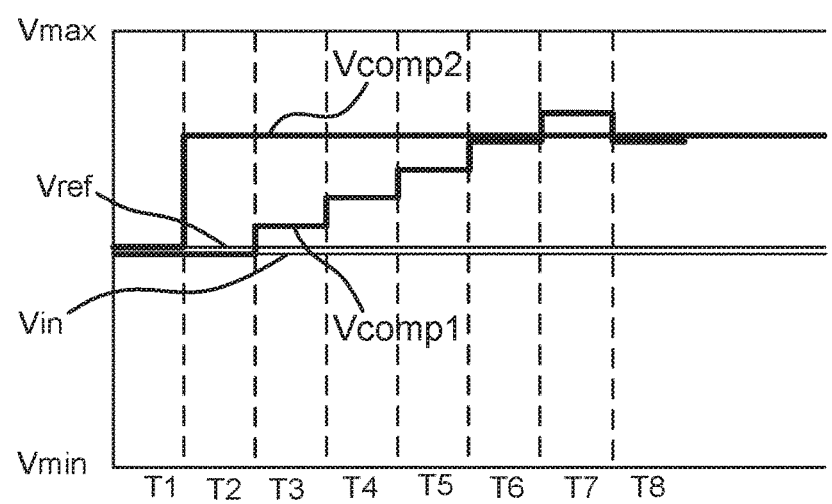
FIG. 9 is a waveform diagram illustrating operation of the SAR ADC of FIG. 7.

FIG. 9 is a waveform diagram illustrating operation of an embodiment of an SAR ADC, such as the SAR ADC 500 of FIG. 7. As shown, analog input voltage Vin is less than a reference voltage Vref and is greater than the minimum analog input voltage Vmin. In addition, as shown, reference voltage Vref is substantially equal to half the difference between maximum analog input voltage Vmax and minimum analog input voltage Vmin.

In the example illustrated in FIG. 9, the SAR ADC uses a linear search SAR method. As understood by those of skill in the art, other SAR methods, such as a binary search, may be used.

During the time period T1, the SAR logic 530 causes the switches of CDAC 510 and switch 552 to be connected either to the gnd reference or to the reference voltage Vref and causes switch 554 to be closed. In addition, CDAC 510 causes voltage Vcomp1 to be equal to or substantially equal to the analog voltage Vin. Further, comparator 520 generates a comparison value indicating that the analog voltage Vin is less than the Vcomp2, which is equal to the reference voltage Vref. Also, based on the comparison value, SAR logic 530 determines the MSB of the digital output, determines that subsequent values of voltage Vcomp1 will be greater than the analog input value, and determines that Vcomp2 will be equal to Vref plus a predetermined voltage.

During the time period T2, as a result of the analog voltage Vin being less than the reference voltage during time period T1, SAR logic 530 causes the switches of CDAC 510 and switch 552 to be connected to the gnd reference voltage and causes switch 554 to be closed while the analog input voltage Vin is sampled such that the voltage at node Vcomp1 is substantially equal to the analog input voltage Vin. After the analog input voltage is sampled, the voltage at Vcomp2 is increased by the predetermined voltage by causing switch 552 to be connected to the reference voltage Vref.

Also during the time period T2, comparator 520 generates a comparison value indicating that the voltage Vcomp1 is less than the voltage Vcomp2 as a result of the voltage Vcomp1 being less than the voltage at Vcomp2 (voltage Vref plus the predetermined voltage), and SAR logic 530 determines that the next Vcomp1 is to be greater than the current Vcomp1 as a result of the voltage Vcomp1 being less than the voltage Vref plus the predetermined voltage.

During the time period T3, as a result of a next digital input word from SAR logic 530, CDAC 510 causes voltage Vcomp1 to be equal to or substantially equal to the previous voltage Vcomp1 plus a voltage step, where the magnitude of the voltage step corresponds with the charge of the capacitor of CDAC 510 having value C. In addition, during time period T3, comparator 520 generates a comparison value indicating that the voltage Vcomp1 is less than the voltage at Vcomp2 (voltage Vref plus the predetermined voltage), and SAR logic 530 determines that the next Vcomp1 is to be greater than the current Vcomp1 as a result of the voltage Vcomp1 being less than the voltage Vref minus the predetermined value.

During the time period T4, as a result of a next digital input word from SAR logic 530, CDAC 510 causes voltage Vcomp1 to be equal to or substantially equal to the previous voltage Vcomp1, plus a voltage step, where the magnitude of the voltage step corresponds with the charge of the capacitor of CDAC 510 having value C. In addition, during time period T4, comparator 520 generates a comparison value indicating that the voltage Vcomp1 is less than the voltage at Vcomp2 (voltage Vref plus the predetermined voltage), and SAR logic 530 determines that the next Vcomp1 is to be greater than the current Vcomp1 as a result of the voltage Vcomp1 being less than the voltage Vref plus the predetermined value.

During the time period T5, as a result of a next digital input word from SAR logic 530, CDAC 510 causes voltage Vcomp1 to be equal to or substantially equal to the previous voltage Vcomp1, plus a voltage step, where the magnitude of the voltage step corresponds with the charge of the capacitor of CDAC 510 having value C. In addition, during time period T5, comparator 520 generates a comparison value indicating that the voltage Vcomp1 is less than the voltage at Vcomp2 (voltage Vref plus the predetermined voltage), and SAR logic 530 determines that the next Vcomp1 is to be greater than the current Vcomp1 as a result of the voltage Vcomp1 being less than the voltage Vref minus the predetermined value.

During the time period T6, as a result of a next digital input word from SAR logic 530, CDAC 510 causes voltage Vcomp1 to be equal to or substantially equal to the previous voltage Vcomp1, plus a voltage step, where the magnitude of the voltage step corresponds with the charge of the capacitor of CDAC 510 having value C. In addition, during time period T6, comparator 520 generates a comparison value indicating that the voltage Vcomp1 is less than the voltage Vcomp2 (voltage Vref plus the predetermined voltage), and SAR logic 530 determines that the next Vcomp1 is to be greater than the current Vcomp1 as a result of the voltage Vcomp1 being less than the voltage Vref plus the predetermined value.

During the time period T7, as a result of a next digital input word from SAR logic 530, CDAC 510 causes voltage Vcomp1 to be equal to or substantially equal to the previous voltage Vcomp1, plus a voltage step, where the magnitude of the voltage step corresponds with the charge of the capacitor of CDAC 510 having value C. In addition, during time period T7, comparator 520 generates a comparison value indicating that the voltage Vcomp1 is greater than the voltage Vcomp2 (voltage Vref plus the predetermined voltage), and SAR logic 530 determines that the next Vcomp1 is to be less than the current Vcomp1 as a result of the voltage Vcomp1 being greater than the voltage Vref plus the predetermined value.

In some embodiments, because all the information for determining the digital output word is available after time period T7, the SAR logic 530 determines the digital output word according to principles and aspects discussed elsewhere herein and/or otherwise known to those of skill in the art.

In the exemplary embodiment of FIG. 9, during the time period T8, as a result of a next digital input word from SAR logic 530, CDAC 510 causes voltage Vcomp1 to be equal to or substantially equal to the previous voltage Vcomp1, minus a voltage step, where the magnitude of the voltage step corresponds with the charge of the capacitor of CDAC 510 having value C.

As a result of the voltage Vcomp1 being greater than the voltage Vref minus the predetermined voltage during time period T7, the SAR logic 530 generates the digital output word corresponding to the analog input voltage Vin.

Because analog input voltage Vin was determined to be less than the reference voltage Vref during time period T1, the MSB of the digital output word corresponds with that determination. In addition, because the digital input word from SAR logic 530 for CDAC 510 of time period T6 or T8 corresponds with the voltage difference between the reference voltage Vref plus the predetermined value and analog input voltage Vin, and the bits of the digital output word other than the MSB also correspond with the voltage difference between the reference voltage Vref plus the predetermined value and analog input voltage Vin, the digital input word from SAR logic 130 for CDAC 110 of time period T6 or T8 minus a digital representation of the predetermined voltage corresponds with the bits of the digital output word other than the MSB.

For example, if, in the example of FIG. 9, the maximum input voltage Vmax is 1 V, and the analog input voltage Vin is 0.46 V, a 4-bit digital word corresponding to the analog input voltage, may be 0111. The value of 0 for the MSB is determined during time period T1. During time period T2, a predetermined voltage of 0.25 volts is added to voltage Vcomp2, such that Vcomp2 is 0.75 V. In addition, because the digital input word from SAR logic 130 for CDAC 110 of time period T6 or T8 causes the voltage Vcomp1 to be equal to or substantially equal to the analog input voltage Vin plus four voltage steps, where the magnitude of the voltage steps each correspond with the charge of the capacitor of CDAC 110 having value C, the other bits of the digital output word correspond with a voltage difference between the analog input voltage Vin and the reference voltage Vref plus the predetermined voltage value, which corresponds digitally to 100. Accordingly, the digital output word is determined to be the expected 0111 because 0111 (maximum value for Vin<Vref, as determined during time period T1)−0100 (four voltage steps from SAR algorithm, as determined during time period T6 and/or T8)+0100 (digital representation of predetermined voltage value)=0111, where 0111 represents the digitized value of the analog input voltage Vin.

Once determined, the SAR ADC 100 represents the digital output word on the output Dout.

In the example embodiments discussed herein, the voltages discussed are examples of signals. In alternative embodiments, the circuitry is configured to generate and process signals embodied differently. For example, in some embodiments, one or more of the signals are embodied as currents or other types of signals.

Though the present invention is disclosed by way of specific embodiments as described above, those embodiments are not intended to limit the present invention. Based on the methods and the technical aspects disclosed above, variations and changes may be made to the presented embodiments by those skilled in the art without departing from the spirit and the scope of the present invention.

What is claimed is:

1. A successive approximation register (SAR) analog to digital converter (ADC), comprising:
   a SAR logic circuit configured to generate a digital input word;
   a DAC, configured to receive the digital input word and an analog input, and to generate a first signal based on the analog input and the digital input word; and
   a comparator, comprising:
   a first input terminal configured to receive the first signal, and
   a second input terminal configured to receive a second signal,
   wherein the comparator is configured to generate a comparator output based on the first and second signals, wherein the comparator output has a value corresponding with a sign of a difference between the first and second signals,
   wherein, during a first time period, the second signal is equal to a reference signal, the first signal is equal to the analog input, and the comparator is configured to generate a first comparator output based on the first and second signals of the first time period, and
   wherein, during a second time period, the second signal is equal to the reference signal, the first signal is equal to the analog input plus a predetermined voltage, and the comparator is configured to generate a second comparator output based on the first and second signals of the second time period,
   wherein the SAR logic circuit is further configured to receive the first and second comparator outputs, and to generate the digital input word for the DAC based on the first and second comparator outputs.

2. The SAR ADC of claim 1, wherein the SAR logic is configured to generate a digital output word corresponding with the analog input, and to determine an MSB of the digital output word based on the first comparator output.

3. The SAR ADC of claim 1, wherein the SAR logic is configured to generate a digital representation of the analog input based on the first and second comparator outputs.

4. The SAR ADC of claim 1,
   wherein, during a third time period, the second signal is equal to the reference signal, and the first signal is equal to the analog input plus the predetermined voltage plus a step,
   wherein the sign of the step is determined by the SAR logic based on the second comparator output, and
   wherein the comparator is configured to generate a third comparator output based on the first and second signals of the third time period.

5. The SAR ADC of claim 4, wherein the SAR logic is configured to generate a digital representation of the analog input based on the first, second, and third comparator outputs.

6. The SAR ADC of claim 1, wherein the DAC comprises a plurality of capacitors and a plurality of switches, wherein each of the switches is connected to a particular one of the capacitors, is selectively connected to either of a ground voltage and a reference voltage, and is configured to selectively connect the particular capacitor to either of the ground voltage and the reference voltage.

7. The SAR ADC of claim 6, wherein, during the second time period, the SAR logic is configured to cause the DAC to generate the first signal such that the first signal is equal to a voltage of the analog input plus the predetermined voltage, wherein, in response to the first comparator output indicating that the analog input is less than the reference signal, while the first signal is generated, one or more of the switches of the DAC are switched from being connected to the ground voltage to being connected to the reference voltage.

8. The SAR ADC of claim 7, wherein the one or more switches correspond with the particular capacitors of the DAC which, in response to the one or more switches being switched, cause a voltage of the first signal to increase by the predetermined voltage.

9. The SAR ADC of claim 6, wherein, during the second time period, the SAR logic is configured to cause the DAC to generate the first signal such that the first signal is equal to a voltage of the analog input minus the predetermined voltage, wherein, in response to the first comparator output indicating that the analog input is greater than the reference signal, while the first signal is generated, one or more of the switches of the DAC are switched from being connected to the reference voltage to being connected to the ground voltage.

10. The SAR ADC of claim 9, wherein the one or more switches correspond with the particular capacitors of the DAC which, in response to the one or more switches being switched, cause a voltage of the first signal to decrease by the predetermined voltage.

11. A method of using a successive approximation register (SAR) analog to digital converter (ADC) to determine a digital output word having a value corresponding with a value of an analog input, the method comprising:
   with an SAR logic circuit of the SAR ADC, generating a digital input word;
   with a DAC of the SAR ADC:
   receiving the digital input word and the analog input, and
   generating a first signal based on the analog input and the digital input word;
   with a comparator of the SAR ADC:
   receiving the first signal at a first input terminal,
   receiving a second signal at a second input terminal, and
   generating a comparator output based on the first and second signals, wherein the comparator output has a value corresponding with a sign of a difference between the first and second signals, wherein, during a first time period, the second signal is equal to a reference signal, the first signal is equal to the analog input, and the comparator is configured to generate a first comparator output based on the first and second signals of the first time period, and wherein, during a second time period, the second signal is equal to the reference signal, the first signal is equal to the analog input plus a predetermined voltage, and the comparator is configured to generate a second comparator output based on the first and second signals of the second time period; and with the SAR logic circuit of the SAR ADC:
receiving the first and second comparator outputs, and
generating the digital input word for the DAC based on the first and second comparator outputs.

12. The method of claim 11, further comprising, with the SAR logic, determining an MSB of the digital output word based on the first comparator output.

13. The method of claim 11, further comprising, with the SAR logic, generating a digital representation of the analog input based on the first and second comparator outputs.

14. The method of claim 11,
wherein, during a third time period, the second signal is equal to the reference signal, and the first signal is equal to the analog input plus the predetermined voltage plus a step,
wherein the sign of the step is determined by the SAR logic based on the second comparator output, and
wherein the method further comprises, with the comparator, generating a third comparator output based on the first and second signals of the third time period.

15. The method of claim 14, further comprising, with the SAR logic, generating a digital representation of the analog input based on the first, second, and third comparator outputs.

16. The method of claim 11, wherein the DAC comprises a plurality of capacitors and a plurality of switches, wherein each of the switches is connected to a particular one of the capacitors, and is selectively connected to either of a ground voltage and a reference voltage, and wherein the method further comprises, with the switches, connecting each particular capacitor to either of the ground voltage and the reference voltage.

17. The method of claim 16, further comprising, during the second time period, with the SAR logic:
causing the DAC to generate the first signal such that the first signal is equal to a voltage of the analog input plus the predetermined voltage, and,
in response to the first comparator output indicating that the analog input is less than the reference signal, while the first signal is generated, switching one or more of the switches of the DAC from being connected to the ground voltage to being connected to the reference voltage.

18. The method of claim 17, wherein the one or more switches correspond with the particular capacitors of the DAC which, in response to the one or more switches being switched, cause a voltage of the first signal to increase by the predetermined voltage.

19. The method of claim 16, further comprising, during the second time period, with the SAR logic:
causing the DAC to generate the first signal such that the first signal is equal to a voltage of the analog input minus the predetermined voltage, and,
in response to the first comparator output indicating that the analog input is greater than the reference signal, while the first signal is generated, switching one or more of the switches of the DAC from being connected to the reference voltage to being connected to the ground voltage.

20. The method of claim 19, wherein the one or more switches correspond with the particular capacitors of the DAC which, in response to the one or more switches being switched, cause a voltage of the first signal to decrease by the predetermined voltage.

* * * * *